(12) United States Patent
Holmes et al.

(10) Patent No.: US 11,107,968 B1
(45) Date of Patent: Aug. 31, 2021

(54) ALL-SEMICONDUCTOR JOSEPHSON JUNCTION DEVICE FOR QUBIT APPLICATIONS

(71) Applicant: INTERNATIONAL BUSINESS MACHINES CORPORATION, Armonk, NY (US)

(72) Inventors: Steven J. Holmes, Ossining, NY (US); Devendra K. Sadana, Pleasantville, NY (US); Oleg Gluschenkov, Tannersville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/825,535

(22) Filed: Mar. 20, 2020

(51) Int. Cl.
*H01L 39/22* (2006.01)
*H01L 39/24* (2006.01)
*H01L 39/12* (2006.01)

(52) U.S. Cl.
CPC ............ *H01L 39/223* (2013.01); *H01L 39/12* (2013.01); *H01L 39/2493* (2013.01)

(58) Field of Classification Search
CPC .... H01L 39/223; H01L 39/12; H01L 39/2493
See application file for complete search history.

(56) References Cited

U.S. PATENT DOCUMENTS

| 7,247,603 | B2 | 7/2007 | Cantor et al. |
| 9,559,284 | B2 | 1/2017 | Chang et al. |
| 10,367,133 | B1 | 7/2019 | Tahan |
| 2019/0165246 | A1 | 5/2019 | Rosenblatt et al. |
| 2019/0236476 | A1 | 8/2019 | Pereverzev |
| 2019/0305038 | A1* | 10/2019 | Michalak .............. H01L 21/743 |

FOREIGN PATENT DOCUMENTS

EP      0017389 B1    12/1982

OTHER PUBLICATIONS

Bustarret et al. "Superconductivity in doped cubic silicon", Nature, vol. 444, Nov. 23, 2006.
Hoummada et al., "Absence of boron aggregates in superconducting silicon confirmed by atom probe tomography", Applied Physics Letters 101, 182602 (2012).
Grockowiak et al., "Superconducting properties of laser annealed implanted Si:B epilayers", Supercond. Sci. Technol. 26 (2013) 045009 (4pp).
Chiodi et al., "All silicon Josephson junctions", rXiv:1610.08453v1 [cond-mat.mes-hall] Oct, 26, 2016.

(Continued)

*Primary Examiner* — Matthew L Reames
(74) *Attorney, Agent, or Firm* — Henry J. Daley; Venable LLP

(57) ABSTRACT

According to an embodiment of the present invention, a quantum mechanical device includes a monolithic crystalline structure. The monolithic crystalline structure includes a first region doped to provide a first superconducting region, and a second region doped to provide a second superconducting region, the second superconducting region being separated from the first superconducting region by an undoped crystalline region. The first and second superconducting regions and the undoped crystalline region form a Josephson junction.

20 Claims, 12 Drawing Sheets

(56) References Cited

OTHER PUBLICATIONS

Marcenat et al., "Low-temperature transition to a superconducting phase in boron-doped silicon films grown on (001)-oriented silicon wafers", Physical Review B 81, 020501(R) 2010.
Shim et al., "Bottom-up superconducting and Josephson junction devices inside a group-IV semiconductor", Nature Communications | DOI: 10.1038/ncomms5225.
Chiodi et al., "Proximity induced superconductivity in all silicon Superconductor/ Normal junctions", Physical Review B, vol. 96, Jul. 1, 2017, p. 024503, XP055806524.
Black-Schaffer et al., "Self-consistent solution for proximity effect and Josephson current in ballistic graphene SNS Josephson junctions", Arxiv.Org, Cornell University Library, 201 Olin Library Cornell University Ithaca, Ithaca, NY 14853, Mar. 25, 2008, XP080405831, PHYSREVB.78.024504.
PCT/EP2021/053793 International Search Report dated Jul. 5, 2021.
PCT/EP2021/053793 Written Opinion dated Jul. 5, 2021.

\* cited by examiner

ALL-SEMICONDUCTOR JOSEPHSON JUNCTION DEVICE FOR QUBIT APPLICATIONS

BACKGROUND

The currently claimed embodiments of the present invention relate to quantum mechanical devices, and more specifically, to an all-semiconductor Josephson junction device for qubit applications.

Coherence times of Josephson junction qubits are generally low, possibly related to the number of processing steps and the use of defective materials. For example, aluminum oxide is commonly used to form a Josephson junction dielectric. However, aluminum oxide is known to have open structures that can couple to the Josephson junction qubit, reducing the qubit coherence time. Materials and methods are needed for improving coherence times in Josephson junction devices.

SUMMARY

According to an embodiment of the present invention, a quantum mechanical device includes a monolithic crystalline structure. The monolithic crystalline structure includes a first region doped to provide a first superconducting region, and a second region doped to provide a second superconducting region, the second superconducting region being separated from the first superconducting region by an undoped crystalline region. The first and second superconducting regions and the undoped crystalline region form a Josephson junction.

According to an embodiment of the present invention, a method of producing a quantum mechanical device includes providing a crystalline substrate, and doping first and second regions of the crystalline substrate to form first and second superconducting regions while reserving a region between the first and second superconducting regions as an undoped crystalline region. The first and second superconducting regions and the undoped crystalline region form a Josephson junction.

According to an embodiment of the present invention, a method of producing a quantum mechanical device includes providing a crystalline substrate, and implanting first and second regions of the crystalline substrate with a dopant, the first and second regions being separated by an undoped crystalline region. The method includes annealing the first and second regions to form the first and second superconducting regions. The annealing includes driving the dopant laterally into the undoped crystalline region to form a conducting region. The first and second superconducting regions and the conducting region form a Josephson junction.

DETAILED DESCRIPTION

Figure 1A:
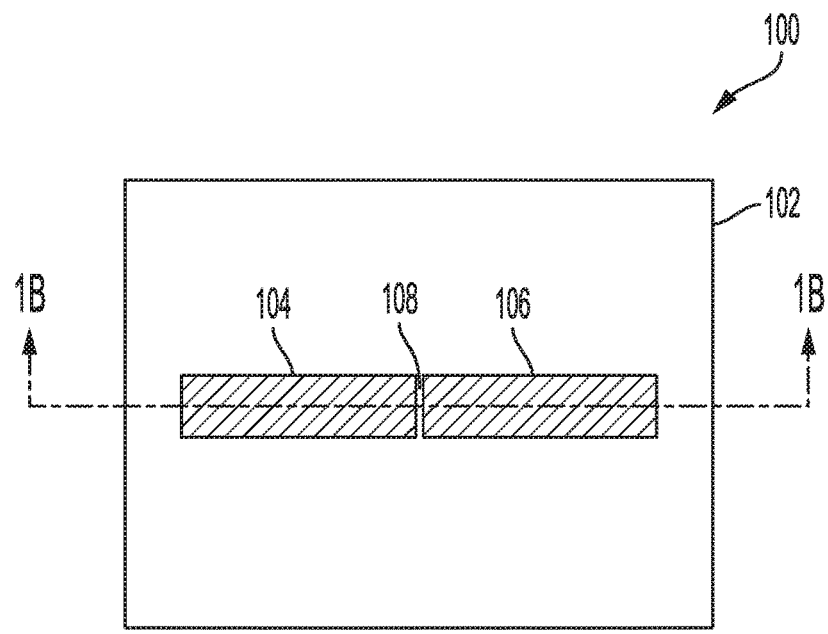
FIG. 1A is a schematic illustration of a plan view of a quantum mechanical device according to an embodiment of the present invention.
Figure 1B:
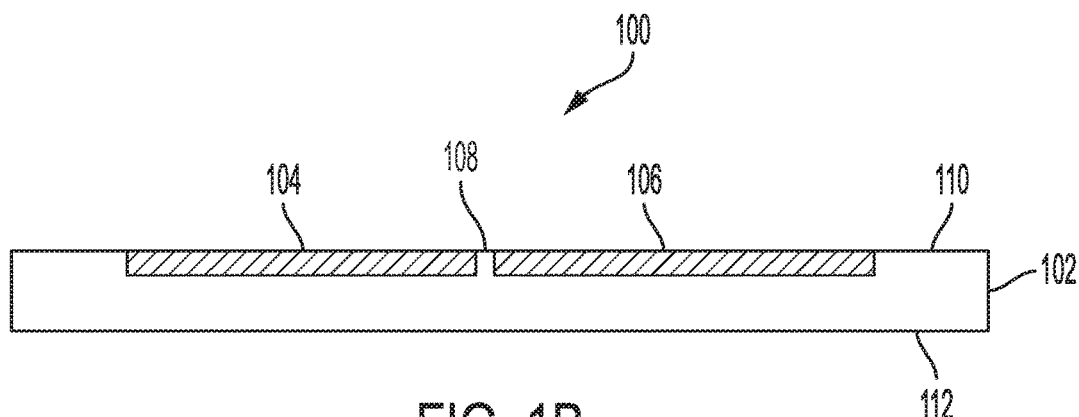
FIG. 1B is a schematic illustration of a cross-sectional view of a quantum mechanical device according to an embodiment of the present invention.

FIGS. 1A and 1B are schematic illustrations of a plan view and a cross-sectional view of a quantum mechanical device 100 according to an embodiment of the present invention. The quantum mechanical device 100 includes a monolithic crystalline structure 102. The monolithic crystalline structure 102 includes a first region doped to provide a first superconducting region 104, and a second region doped to provide a second superconducting region 106. The second superconducting region 106 is separated from the first superconducting region 104 by an undoped crystalline region 108. The first and second superconducting regions 104, 106 and the undoped crystalline region 108 form a Josephson junction.

Figure 1C:
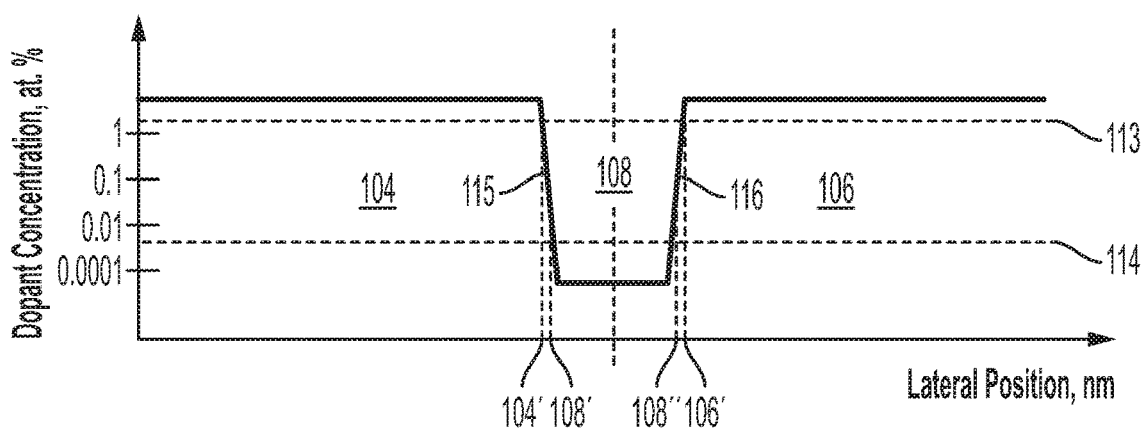
FIG. 1C is a schematic illustration of a lateral dopant concentration profile according to an embodiment of the present invention.

FIG. 1C is a schematic illustration of the lateral dopant concentration profile across the first superconducting region 104, the undoped crystalline region 108, and the second superconducting region 106. Concentration level 113 is the dopant concentration at which dopant-semiconductor alloy becomes superconducting. For Si:B, this level is at or above about 2 atomic percent (at. %) or, equivalently, 1e21 cm$^{-3}$. Concentration level 114 is the dopant concentration at which the doped semiconductor develops a metallic-type conductivity persistent at low temperatures. For Si:B, this level is at or above about 0.008 at. % or, equivalently, 4e18 cm$^{-3}$. The term "low temperatures" may refer to the operating temperatures of the quantum mechanical device 100.

The transition interfacial region between layers 104 and 108 has two boundaries labeled 104' and 108' where the dopant concentration crosses concentration levels 113 and 114, respectively. Region 104 located at the left of the boundary 104' is superconducting at low temperature. Region 108 located at the right of the boundary 108' is insulating at low temperature. The region in between boundaries 104' and 108' remains conductive at low temperature with a finite conductivity. Similarly, the transition interfacial region exists between layers 108 and 106 with two boundaries labeled 108" and 106' where the dopant concentration crosses concentration levels 114 and 113, respectively. Region 106 located at the right of the boundary 106' is superconducting at low temperature. The region in between boundaries 108" and 106' remains conductive at low temperature with a finite conductivity.

The transition interfacial regions between layers 104 and 108 and 108 and 106 may be minimized in thickness. This is achieved with increasing abruptness of the dopant concentration profile labeled as 115 and 116 for left and right transition regions. The abruptness of the dopant concentration profile is expressed in nm per decade of dopant spatial decay. A higher abruptness of the concentration dopant profile results in a lower nm per decade number. According to some embodiments, the dopant concentration profile has an abruptness of less than 1 nm/decade.

The term "undoped crystalline region" may be used herein to indicate a semiconductor having sufficiently low doping that its electrical conductivity vanishes at low temperature making it an insulator. This naturally happens for normal doped semiconductors where the doping level is below a critical value of the metal-insulator (Mott) transition. The Mott transition is where the dopant orbitals overlap forming a subband with metallic-type conductivity that persists at low temperatures. For an Si:B system, the Mott transition occurs at around 4e18 cm$^{-3}$. Accordingly, the undoped crystalline region according to some embodiments of the invention is a Si layer with B below 4e18 cm$^{-3}$.

The term "monolithic crystalline structure" may be used herein to indicate a substrate formed from a single piece of material, as opposed to a substrate that includes a base substrate with layers of other material deposited on top of the base substrate to form a piecemeal substrate. The monolithic crystalline structure may be doped or alloyed to incorporate various materials into regions of the substrate. The monolithic crystalline structure may be any suitable substrate with a semiconductor crystalline surface and two or more portions made of semiconductor exhibiting superconductivity at low temperatures when heavily doped. The substrate may include insulating layers, other semiconducting structures, other metallic structures, and other useful devices such as capacitors, inductors, pre-build transistors, and circuits. The substrates according to some embodiments may be bulk semiconductor substrates made of semiconductors exhibiting superconductivity such as Si, Ge, SiC, and diamond (C).

According to some embodiments of the present invention, the monolithic crystalline structure 102 includes undoped crystalline Si, and the first and second superconducting regions 104, 106 include superconducting Si. According to some embodiments, the first and second superconducting regions 104, 106 include B-doped Si. According to some embodiments, the first and second superconducting regions 104, 106 include Ga-doped Si. According to some embodiments, the monolithic crystalline structure 102 includes undoped crystalline Ge, and the first and second superconducting regions 104, 106 include Ga-doped Ge or Al-doped Ge. The highest amount of metastable dopant-semiconductor compound may be of the order of 10-30 at. %. More specifically, the highest amount of metastable dopant-semiconductor compound may be about 10 at. % for Ga and Al in Ge and about 20 at. % for B in Si. According to some embodiments, the first and second superconducting regions 104, 106 include p-type superconducting Si or Ge. According to some embodiments, the first superconducting region 104 and the second superconducting region 106 are crystalline. According to some embodiments, the first superconducting region 104 is laterally separated from the second superconducting region 106 by the undoped crystalline region 108.

According to some embodiments of the present invention, the monolithic crystalline structure 102 includes an upper surface 110 a lower surface 112 opposite the upper surface. The first and second superconducting regions 104, 106 and the undoped crystalline region 108 may each include an upper surface that is coplanar with the upper surface 110 of the monolithic crystalline structure 102, as shown in FIG. 1A.

Figure 2:
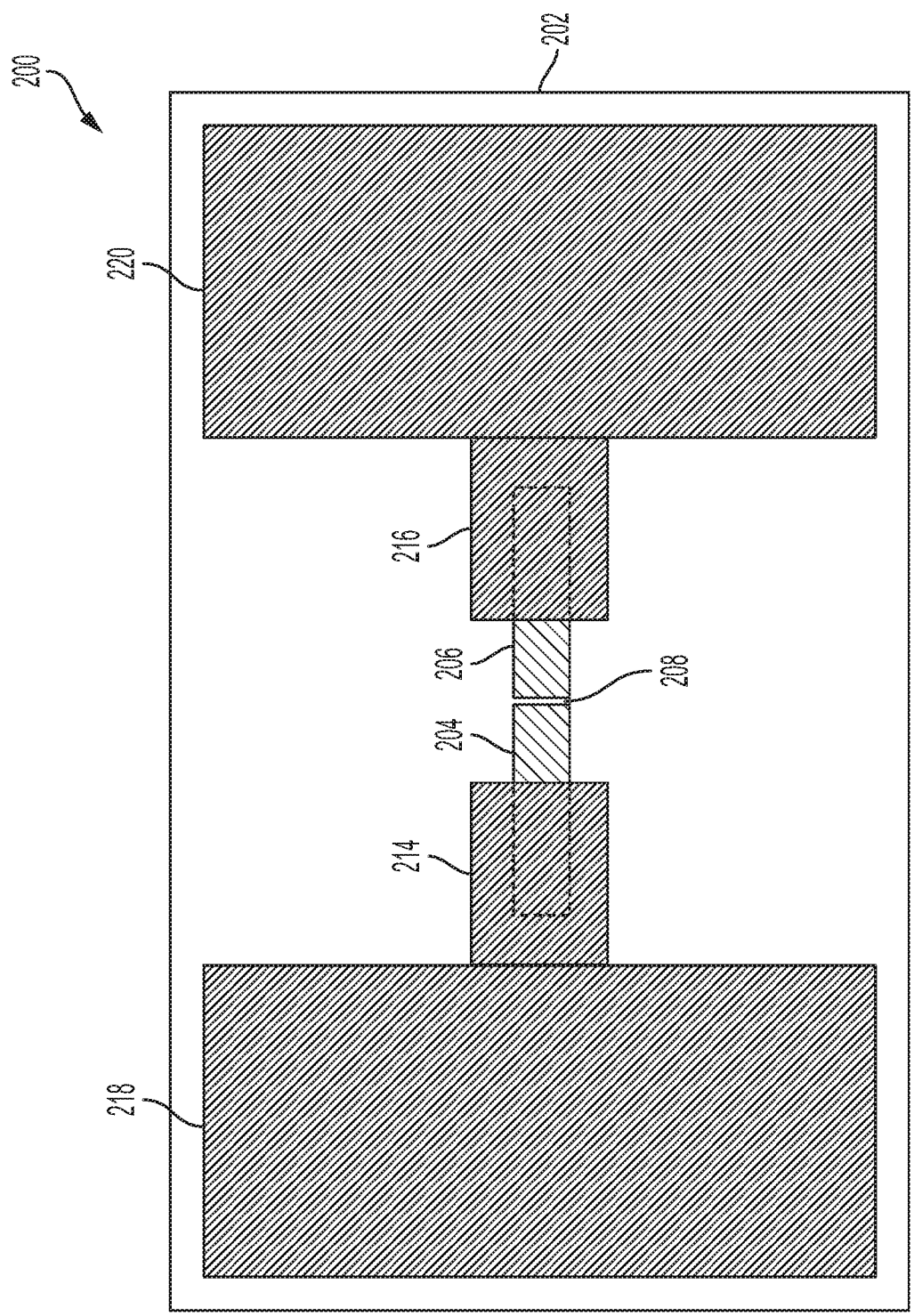
FIG. 2 is a schematic illustration of a quantum mechanical device that includes a pair of capacitors according to an embodiment of the present invention.

FIG. 2 is a schematic illustration of a quantum mechanical device 200 according to an embodiment of the present invention. The quantum mechanical device 200 includes a monolithic crystalline structure 202, a first superconducting region 204, a second superconducting region 206, and an undoped crystalline region 208. The quantum mechanical device 200 includes a superconducting wire 214 disposed on a surface of the monolithic crystalline structure 202 in contact with the first superconducting region 204. The superconducting wire 214 may include a different superconducting material than the first superconducting region 204. For example, the superconducting wire 214 may include Ni, Al, Ta, TaN, TiN, Ti, or V. The quantum mechanical device 200 according to some embodiments includes a second superconducting wire 216 disposed on the surface of the monolithic crystalline structure 202 in contact with the second superconducting region 206. The quantum mechanical device 200 may include a first capacitor 218 in contact with the first-mentioned superconducting wire 214, and a second capacitor 220 in contact with the second superconducting wire 216. The quantum mechanical device 200 may be, for example, a Josephson junction qubit.

Figure 3:
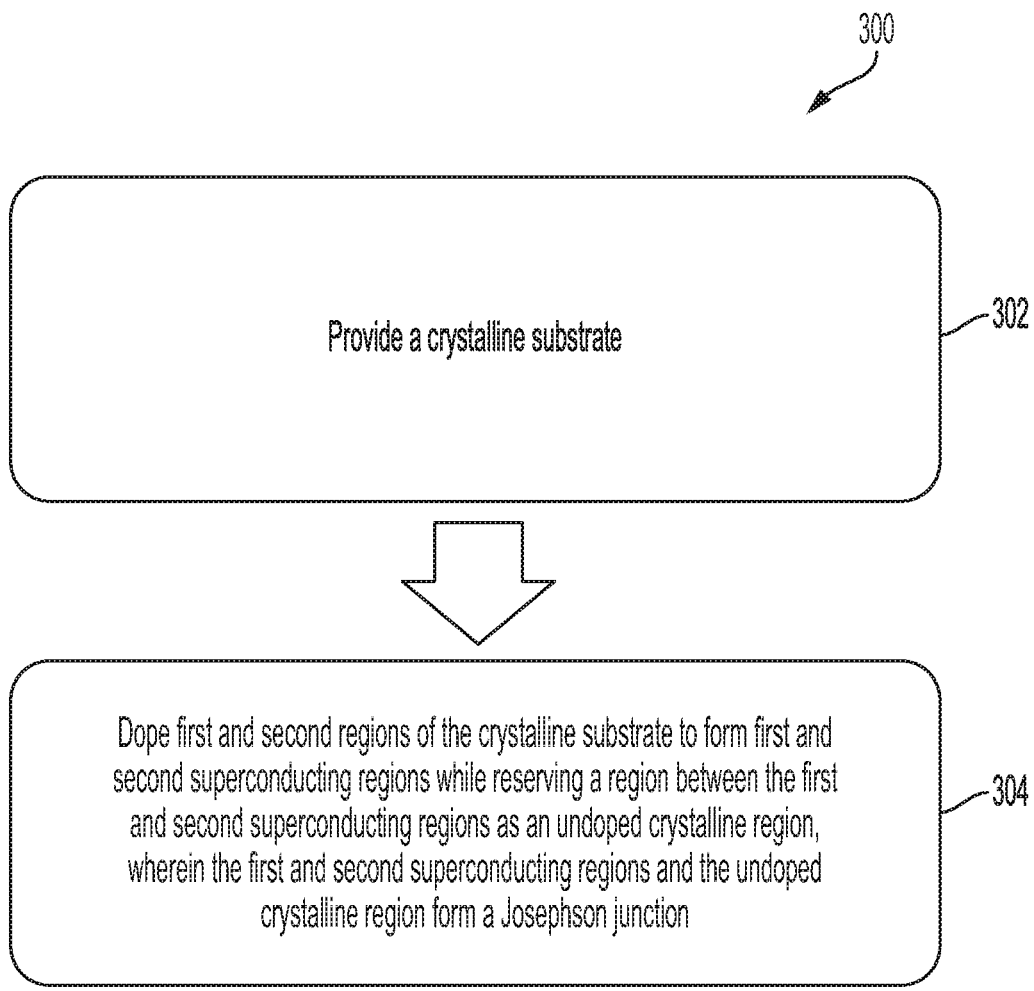
FIG. 3 is a flowchart illustrating a method 300 of producing a quantum mechanical device according to an embodiment of the present invention.

FIG. 3 is a flowchart illustrating a method 300 of producing a quantum mechanical device according to an embodiment of the present invention. The method 300 includes providing a crystalline substrate 302, and doping first and second regions of the crystalline substrate to form first and second superconducting regions while reserving a region between the first and second superconducting regions as an undoped crystalline region, wherein the first and second superconducting regions and the undoped crystalline region form a Josephson junction 304.

Figure 4:
FIG. 4 is a schematic illustration of a cross-sectional view of a substrate with a capping layer formed thereon according to an embodiment of the present invention.

FIGS. 4-9B schematically illustrate an example process for forming a quantum mechanical device according to some embodiments of the invention. FIG. 4 is a schematic illustration of a cross-sectional view of a substrate 400. The substrate 400 may be, for example, a crystalline substrate. The substrate 400 may be, for example, an undoped or lightly doped Si substrate. The process for forming the quantum mechanical device includes doping first and second regions of the substrate 400 to form first and second superconducting regions while reserving a region between the first and second superconducting regions as an undoped crystalline region. The process for doping the first and second regions may include forming a capping layer 402 on the substrate 400. The capping layer 402 may include, for example, $SiO_2$.

Figure 5A:
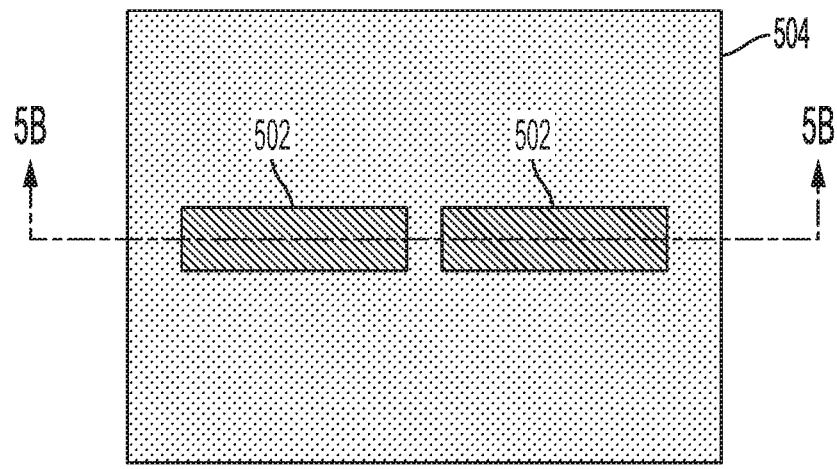
FIG. 5A is a schematic illustration of a plan view of a substrate and capping layer with a patterned resist formed on top of the capping layer according to an embodiment of the present invention.
Figure 5B:
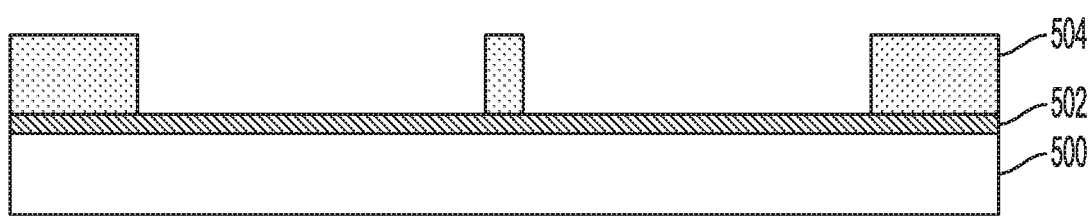
FIG. 5B is a schematic illustration of a cross-sectional view of a substrate and capping layer with a patterned resist formed on top of the capping layer according to an embodiment of the present invention.

The process may include depositing a resist on the capping layer, and patterning the resist. FIGS. 5A and 5B are schematic illustrations of a plan view and a cross-sectional view of a substrate 500 and capping layer 502 with a patterned resist 504 formed on top of the capping layer 502. The patterned resist 504 exposes two portions of the capping layer 502.

Figure 6A:
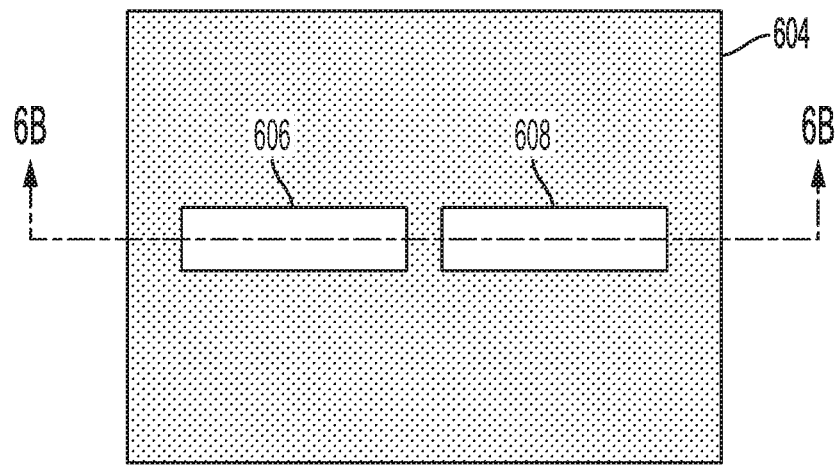
FIG. 6A is a schematic illustration of a plan view of a substrate, a capping layer, and a resist according to an embodiment of the present invention.
Figure 6B:
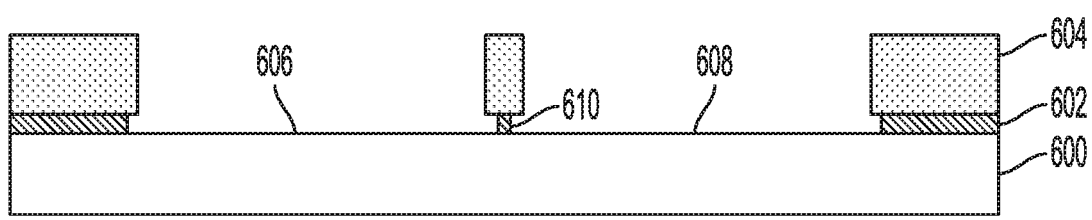
FIG. 6B is a schematic illustration of a cross-sectional view of a substrate, a capping layer, and a resist according to an embodiment of the present invention.

The process may include etching the capping layer to expose a first portion and a second portion of the monolithic crystalline structure. FIGS. 6A and 6B are schematic illustrations of a plan view and a cross-sectional view of a substrate 600, a capping layer 602, and a resist 604. The etched capping layer 602 exposes a first portion 606 and a second portion 608 of the substrate 600 where first and second superconducting regions will be formed. The capping layer 602 may be etched using, for example, chemical oxide removal (COR) or diluted hydroflouric acid solution (DHF). The resist 604 is undercut to reduce the size of the portion 610 of the capping layer 602 between the first portion 606 and the second portion 608. The portion 610 may be reduced to a sub-lithographic size. For example, the portion 610 may have a width less than 5 nm. According to some embodiments, the portion 610 may have a width of 3 nm or less. The frequency of the Josephson junction device can be tuned by adjusting the image size of the portion 610. The portion 610 may be referred to herein as an oxide mandrel. In some embodiments, the width of the oxide mandrel 610 can be made wider to accommodate implant lateral straggle and/or dopant diffusion conducted in the next process steps as detailed below. In some examples, the width of the oxide mandrel can be 15 nm to accommodate 5-6 nm of dopant implant straggle and diffusion from each side of the mandrel.

Figure 7A:
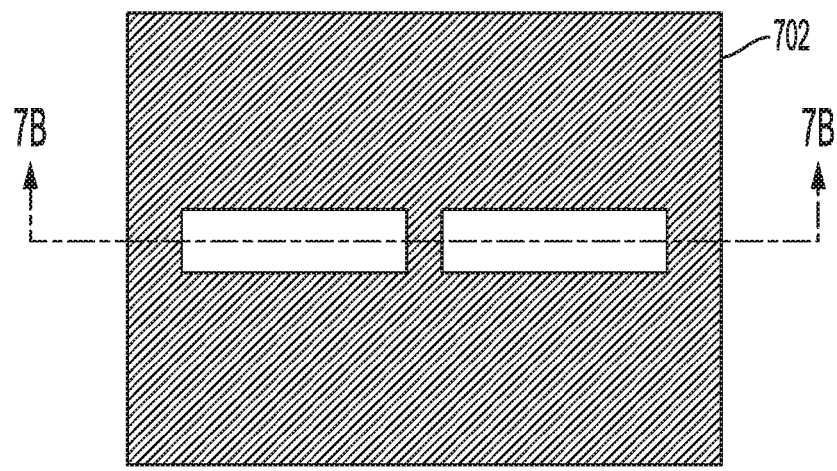
FIG. 7A is a schematic illustration of a plan view of a substrate and an etched capping layer, after the resist has been stripped according to an embodiment of the present invention.
Figure 7B:
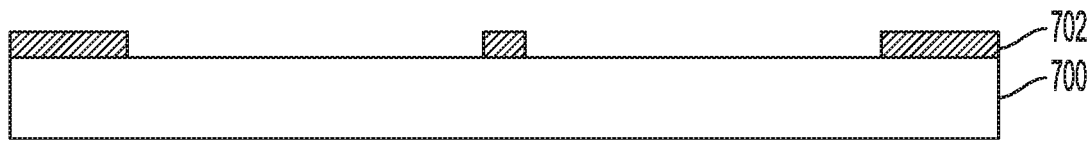
FIG. 7B is a schematic illustration of a cross-sectional view of a substrate and an etched capping layer, after the resist has been stripped according to an embodiment of the present invention.

The process may include stripping the resist. FIGS. 7A and 7B are schematic illustrations of a plan view and a cross-sectional view of a substrate 700 and an etched capping layer 702, after the resist has been stripped.

Figure 8A:
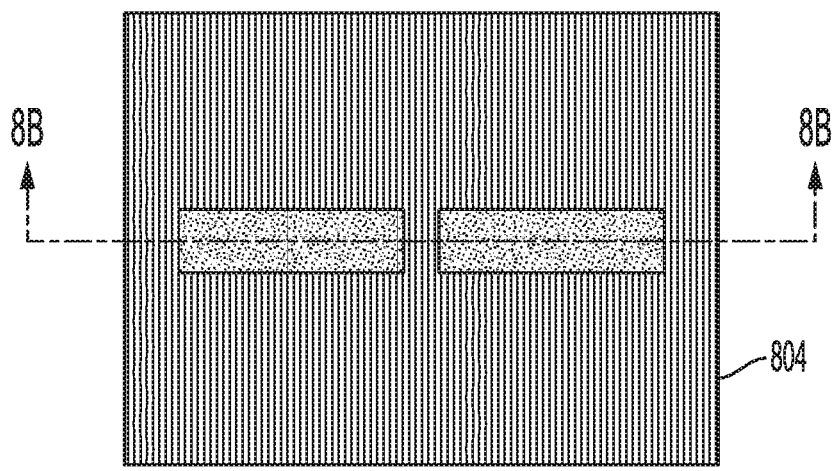
FIG. 8A is a schematic illustration of a plan view of a substrate and an etched capping layer with a layer of dopant adsorbed or implanted on the substrate and the capping layer according to an embodiment of the present invention.
Figure 8B:
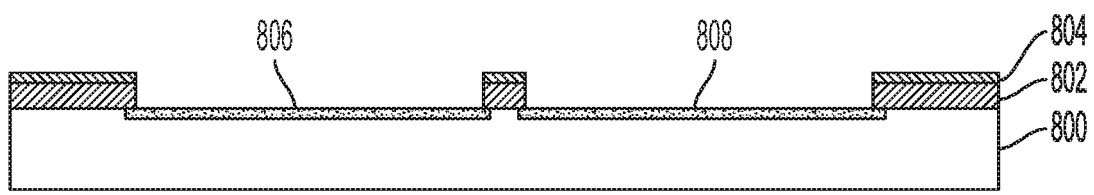
FIG. 8B is a schematic illustration of a cross-sectional view of a substrate and an etched capping layer with a layer of dopant adsorbed or implanted on the substrate and the capping layer according to an embodiment of the present invention.

The doping process may include implanting the first and second regions of the crystalline substrate with a dopant. The doping process may also include adsorbing a dopant into the first and second regions of the crystalline substrate, and annealing the first and second regions. FIGS. 8A and 8B are schematic illustrations of a plan view and a cross-sectional view of a substrate 800 and an etched capping layer 802 with a layer of dopant 804 implanted and/or adsorbed into the substrate 800 and the capping layer 802. The dopant may be, for example, B, Al, or Ga. Once the dopant 804 has been implanted and/or adsorbed into the substrate 800 and the capping layer 802, the substrate 800 may be annealed to form the first region 806 and the second region 808 exhibiting superconductivity at low temperatures. For example, the implanting may include ion beam implantation or plasma immersion implantation. Alternatively, the absorbing doping process may employ gas immersion laser doping. Alternatively, the doping process may include a selective epitaxial growth of doped Si or Ge on the lattice-matched crystalline substrate. A selective epitaxial growth may also include recessing regions 806/808 in exposed substrate 800 using a reactive ion etch (RIE) and backfilling recessed regions with a doped epitaxial material. The doping process may be followed by a laser annealing to form highly-activated, heavily-doped regions 806/808 exhibiting superconductivity at low temperatures. In the case of gas immersion laser doping, absorbing dopant and laser melt annealing are conducted concurrently, wherein the dopants are absorbed into the molten substrate surface during laser annealing and are activated during surface solidification. Alternatively, a solid source of dopants can be deposited over the exposed substrate 800 and then absorbed into the regions 806/808 during laser melt annealing.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases can be controlled and the system parameters can be set so that the depositing atoms arrive at the deposition surface of the semiconductor substrate with sufficient energy to move about on the surface such that the depositing atoms orient themselves to the crystal arrangement of the atoms of the deposition surface. An epitaxially grown semiconductor material can have substantially the same crystalline characteristics as the deposition surface on which the epitaxially grown material is formed. For example, an epitaxially grown semiconductor material deposited on a <100> orientated crystalline surface of silicon can take on a <100> orientation with atoms arrangement and spacing same or similar to those of silicon. In some embodiments of the invention, epitaxial growth and/or deposition processes can be selective to forming on semiconductor surface, and may or may not deposit material on other exposed surfaces, such as silicon dioxide or silicon nitride surfaces.

In some embodiments of the invention, the gas source for the epitaxial deposition of semiconductor material includes a silicon containing gas source, a germanium containing gas source, a carbon containing source or a combination thereof. For example, a silicon layer can be epitaxially deposited or grown from a silicon gas source that is selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. A germanium layer can be epitaxially deposited from a germanium gas source that is selected from the group consisting of germane, digermane, halogermane, dichlorogermane, trichlorogermane, tetrachlorogermane and combinations thereof. A carbon (diamond) layer can be epitaxially deposited from a carbon gas source that is selected from the group consisting of methane, ethylene, acetylene, propane, iso-butane and and combinations thereof. A silicon germanium alloy or silicon carbide layer can be epitaxially formed utilizing a combination of such gas sources. Carrier gases like hydrogen, nitrogen, helium and argon can be used. In some embodiments of the invention, the epitaxial semiconductor materials include in-situ doping with boron, aluminum, or gallium. In this case, gaseous precursors for B, Al, or Ga are added to the gas mixture. These dopant gas sources include diborane for boron, Trimethylaluminium TMA for aluminum, and Trimethylgallium TMG for gallium.

A number of suitable techniques such as shallow ion implantation and in-situ epitaxial growth can be used to heavily dope a semiconductor layer with p-type dopants. As used herein, "heavily doped" means that the atomic concentration of the dopant can exceed $10^{21}$ cm$^{-3}$ (equivalent to approximately 2 atomic percent). In some embodiments of the present invention, the dopant concentration ranges from 2 atomic percent to 30 atomic percent, for example 10 atomic percent. A fast anneal such as a nanosecond anneal may be used at a temperature tuned to melt the heavily doped semiconductor layer to a desired depth. Due to the melting of the semiconductor layers, the dopants redistribute throughout the molten layers, leading to a homogeneous metastable semiconductor-dopant alloy. The atomic concentration of dopants in the resultant alloy exceeds the dopant maximum solid solubility limit. The dopant solid solubility limit (the highest concentration of dopants that can be mixed up into solid semiconductors in a homogeneous fashion) is typically 1-2 atomic percent. A nanosecond-scale anneal allows for mixing up dopants with a liquid semiconductor in concentrations exceeding their respective solid solubility limit and then quenching the liquid solution on the nanosecond scale preserving a highly metastable dopant-semiconductor alloy. Epitaxially grown Si or Ge semiconductors can be doped by adding p-type dopants (e.g., B, Ga, Al), depending on their maximum solid solubility in semiconductor hosts. Boron may be preferred for a Si host due to its high solid solubility in Si, and Ga or Al may be preferred dopants for a Ge host due to their high solid solubilities in Ge. The semiconductor layer can be epitaxially formed and doped by a variety of methods, such as, for example, in-situ doped epitaxy (doping during deposition), implantation and plasma doping, or by gas phase doping including doping during nanosecond anneal also known as the gas immersion laser doping. In-situ doped epitaxy employs gaseous precursors such as diborane $B_2H_6$ for B, Trimethylaluminium TMA for Al, and Trimethylgallium TGA for Ga to incorporate dopant during epitaxial growth. Ion implantation uses purified ionized isotopes such as $^{11}$B, $^{27}$Al, $^{69}$Ga, and $^{71}$Ga to implant selected dopants into exposed substrate 800 to a predetermined depth with a predetermined dose. Plasma immersion doping includes implanting ionized gaseous precursors such as $B_2H_6+$, $BF_3+$, $BCl_3+$, TGA+, TMA+ and their ionized radicals. Gas immersion laser doping may use $B_2H_6$, $BF_3$, or $BCl_3$ gaseous sources for absorbing B into exposed substrate 800. Dopant solid source for laser-induced doping may use pure solid materials such as boron, aluminum, or gallium atop of exposed substrate 800. Each of these doping techniques may have limitations on the amount and purity of dopants that can be incorporated into underlying semiconducting material. One of the chemical limits for incorporating dopants into host solid materials is a physical quantity known as the solid solubility for a particular dopant in a particular host material.

The solid solubility is a function of ambient temperature and often peaks at somewhat below (e.g. 100-200° C. below) the host material melting point. For Si-based semiconductors, a typical maximum solubility limit is reached at around 1100-1250° C. and is typically less than 2-3 atomic percent for common dopants such as B or, equivalently, less than $1.5 \times 10^{21}$ cm$^{-3}$. The solid solubility is lower at lower ambient temperatures such that the homogeneous incorporation of common dopants in Si-based semiconductors does not exceed about 1 at. % or $5 \times 10^{20}$ cm$^{-3}$ at around 1000° C., for instance. In-situ doped epitaxy may be able to trap dopants in the growing host material in excess of the maximum solid solubility limit. However, such non-equilibrium incorporation of dopants into a growing host material typically does not exceed an amount equal to several maximum solubility limits for the dopant-host pair. For Si-based semiconductors, in-situ doped epitaxy may be able to incorporate certain dopants up to several at. % (e.g. up to 4-6 at. %) or, equivalently, up to $3 \times 10^{21}$ cm$^{-3}$. Furthermore, such highly metastable material cannot be sustained at elevated temperatures for prolonged durations. For instance, holding such material at 600° C. for several seconds will precipitate out the excess dopants above the dopant solubility limit at 600° C. which is typically less than $10^{20}$ cm$^{-3}$. Presence of dopant precipitates and clusters in doped homogeneous semiconductors may not be desirable because they may act as scattering centers and may increase quantum decoherence in superconducting devices.

Ion implantation and plasma doping may also introduce dopants well in excess of their maximum solid solubility limit but may require a high-temperature anneal to reform the implantation-damaged semiconductor material, to diffuse and redistribute the dopants in the implanted material, and to place dopants into lattice substitutional sites. Ion implantation has an advantage of providing isotopically purified dopants absent of any inadvertent contamination such as carbon, fluorine, chlorine, hydrogen, or nitrogen. Contamination and inhomogeneity are undesirable because they may contribute to quantum decoherence reducing the qubit coherence time. Ion implantation parameters are selected to implant or place selected dopant isotopes within a predetermined surface layer depth and to a predetermined concentration level. For implanting $^{11}$B+ into Si, the implantation energy ranges from 200 eV to 10 keV enabling implanted surface layer from 5 nm to 80 nm and the implantation dose ranges from 1e15 cm$^{-2}$ to 5e16 cm$^{-2}$ to enable an average boron concentration within the implanted layer of from 1e21 cm$^{-3}$ to 1e22 cm$^{-3}$. The dopant implantation can be aided by a pre-amorphization implant (PAD comprised of elements that are electrically-neutral with respect to electrical conductivity in the substrate. The purpose of PAI is to intentionally damage or amorphize exposed crystal suppressing dopant ion channeling and setting up boundaries for dopant redistribution as discussed below. To avoid any crystal contamination contributing to quantum decoherence, PAI species are chosen to be substrate native ions, e.g. Si+ for Si crystal. PAI energy chosen to set a certain depth of amorphous or damaged crystal layer. PAI dose is chosen to yield a desired level of damage, e.g. amorphization, within the implanted layer. Both PAI energy and PAI dose depend on implantation species and substrate constituents. PAI is generally conducted prior to the dopant implant. For implanting Si+ into Si, the implantation energy ranges from 3 keV to 50 keV enabling amorphous surface layer from 10 nm to 100 nm and the implantation dose ranges from 1e15 $cm^{-2}$ to 5e15 $cm^{-2}$ ensuring full amorphization. Upon implantation, the dopant are redistributed by an annealing process leading to a lower dopant concentration after redistribution. Accordingly, the target dopant implantation dose should account for the doped region volume change during dopant redistribution. For instance, a shallow $^{11}$B+ implant in Si with 500 eV implant energy produces a 7-nm-deep doped region but upon dopant redistribution the doped region becomes 30 nm deep. In this example, the implanted $^{11}$B+ dose of 1.2e16 $cm^{-2}$ leads to boron doping level of about 4e21 $cm^{-3}$ or 8 at. % after redistribution. Redistribution of implanted dopants is particularly challenging because it requires a prolonged high-temperature anneal. Such anneals may cause a precipitation of excess dopants negatively affecting electrical conductivity and device operation.

In some embodiments, laser annealing is employed for forming a heavily doped semiconductor layer that exhibits superconductivity. As used herein, the term "laser annealing" denotes an annealing method that employs a laser to induce heat in the surface being treated. A laser is an electro-optical device that emits coherent radiation. In some embodiments, a typical laser emits light in a narrow, low-divergence beam and with a defined wavelength. In some instances, the advantages of employing laser for annealing processes is that its light can be easily shaped and focused onto a specific area of the annealing surface to achieve very high radiation intensity with short exposure durations.

In some embodiments, the short exposure duration is achieved by raster scanning a focused laser beam over the substrate surface. In this case, the exposure duration measured at incident intensity full-width-at-half-maximum FWHM is the beam width in the scanning direction divided by the scanning velocity. In alternative embodiments, the short exposure duration is achieved by employing a pulsed laser. In this case, the laser beam is shaped to achieve a required peak intensity over a selected substrate area such as over an entire product die and the laser is operated in a pulsed mode such as in the case of Q-switched laser. The pulse duration of Q-switched laser at intensity FWHM determines the substrate exposure time. The exposure process may be repeated for an entire wafer surface in a step-and-repeat approach. In some embodiments, the exposure to light, i.e., by laser annealing, e.g., application of the laser beam, includes 1 pulse to 100 pulses of light exposure.

In some embodiments, the laser type that is employed in the laser annealing method is selected from a solid-state Nd:YAG laser emitting at 1064 nm and frequency-doubled or -tripled emitting at 532 nm or 355 nm, respectively, or an excimer laser emitting at below 400 nm. Excimer lasers can be powered by a chemical reaction involving an excited dimer, or excimer, which is a short-lived dimeric or heterodimeric molecule formed from two species (atoms), at least one of which is in an excited electronic state. Commonly used excimer molecules include F2 (fluorine, emitting at 157 nm), and noble gas compounds such as ArF (193 nm), KrCl (222 nm), KrF (248 nm), XeCl (308 nm), and XeF (351 nm). Excimer lasers are usually operated in a Q-switched, pulsed mode suitable for step-and-repeat pulsed wafer exposure. Solid-state Nd:YAG lasers provide an alternative to excimer lasers due to their stable, high-power output at 1,064 nm that can be efficiently frequency doubled or tripled emitting radiation at 532 nm or 355 nm. Solid state lasers can be configured in continuous, pulsed, or Q-switched pulsed modes suitable for both raster scanning and step-and-repeat pulsed operation. In some embodiments, an XeCl laser (308 nm) may be employed coupling about 40-60% of its incident radiation into semiconductor layer within about 10-20 nm of the surface.

Once the substrate with the heavily doped semiconductor layer is exposed to the laser radiation either through raster scanning or through a laser pulse, its surface temperature begins rising from its base value and falls shortly after. A representative temperature-time trace of a nanosecond laser anneal process includes four distinct temperature regions: initial or base substrate temperature, heat-up portion, temperature peak point, and cool down portion. Initial or base substrate temperature is within the range of from 23° C. (room temperature) to 400° C. This temperature is typically set by a hot plate on which the substrate resides. The laser beam raises the surface temperature of the substrate from the base temperature to the peak with the ramp up rate from about 1,000,000,000° C./sec to about 100,000,000,000° C./sec. After laser radiation exposure, the surface temperature quickly drops back to the base temperature with the temperature ramp down rate of from about 300,000,000° C./sec to about 30,000,000,000° C./sec. The anneal duration measured at around the temperature peak point, typically at a level 50° C. below the peak point, ranges from about 1 nanosecond to about 500 nanoseconds, and typically from around 10 to 100 nanoseconds. It is customary to specify the process duration of laser anneals in terms of the radiation exposure duration at FWHM rather than the anneal duration at the temperature level 50° C. below the peak temperature. These duration quantities are related to each other and, in some embodiments, the anneal duration is a fraction (e.g. about ⅓) of the radiation exposure duration.

Laser-induced surface temperature rise is set by the laser incident radiation intensity, laser pulse or exposure duration, and substrate thermal and optical properties. Short frontside laser exposure causes a non-uniform heating. The heat penetration depth in the case of nanosecond-scale laser pulses ranges from about 1 micron to about 3 microns in semiconductors such as Si or Ge and from about 100 nanometers to about 500 nanometers in typical dielectrics. Accordingly, a relatively thin heavily doped semiconductor layer is heated relatively uniformly throughout its entire thickness with a small top-to-bottom temperature gradient of ~0.1-0.3° C./nm. It will be appreciated that the required radiation intensity at which the heavily doped semiconductor layer reaches its melting point (e.g. 1412° C. for Si or 940° C. for Ge) depends on underlying substrate, laser pulse duration and energy density, and selected laser wavelength. In some embodiments, the heavily doped semiconductor layer is Si doped with B, the nanosecond laser wavelength is 308 nm, the substrate base temperature is 250° C., the pulse duration at FWHM is 160 nanoseconds, and the coupled laser energy density at which the heavily doped Si starts to melt is 0.6 $J/cm^2$ (this corresponds to 1.4 $J/cm^2$ of incident laser energy density). This calibration point can be converted into the required incident laser energy density for a particular choice of semiconductor layer by properly normalizing to the optical reflectance at 308 nm and the difference in melting points for semiconductor layer. For instance, the required incident laser energy density to melt a heavily doped Ge layer (with about 0.47 of optical reflectance at 308 nm) will be around 0.68 J/cm$^2$. While the type of heavily doped semiconductor layer, the substrate structure and the laser parameters may vary affecting the choice of the incident laser energy density, the range of incident laser energy density from about 0.1 J/cm$^2$ to about 3 J/cm$^2$ and laser radiation exposure duration from about 5 to 500 nanoseconds can be employed to melt a heavily doped semiconductor layer.

Dopant diffusivity in the liquid phase is about $10^9$ (a billion) times higher than in the solid phase. Consequently, dopants in the heavily doped region distribute throughout the entirety of the liquid layer, defining a region made of a metastable semiconductor-dopant alloy. Importantly, any dopants in adjacent solid layers do not diffuse due to an ultra-short duration of the anneals. Depending on exact dopant and semiconductor materials, the anneal duration at above the melting point can be selected to allow enough process time for the dopant redistribution. In some embodiments of the invention, selecting appropriate anneal duration can be accomplished by conducting multiple consecutive short-duration anneals.

After redistributing dopants throughout the liquid phase of molten semiconductor layer, the semiconductor structure may be quenched to prevent excess dopant precipitation and clusterization. Quenching causes the liquid layer to undergo a rapid solidification and a quick cooling of resultant solid phase such that the dopants in the resultant solid phase cannot migrate to their nearest neighbor, thus preventing agglomeration of dopants into clusters and precipitates. The speed of quenching is related to the anneal duration; longer anneals have a lower speed of quenching, around $10^{10}$ (ten billion) degrees/second for 100-nsec anneals. Because a high speed of quenching is desired, it may be advantageous to conduct several consecutive shorter anneals, each having a high speed of quenching, instead of a single longer anneal with an equivalent duration but with a lower speed of quenching. Fast quenching produces a metastable heavily-doped p-type semiconductor alloy with homogeneous doping. Such alloy exhibits superconductivity at low temperature and is suitable for superconducting devices.

The atomic percent or concentration of dopants in the resultant heavily doped semiconductor layer exceeds the dopant solid solubility limit in material and is higher than about $1\times10^{21}$ cm$^{-3}$ to obtain a superconducting phase at low temperature. The entire implantation, anneal, and quench process can be repeated any number of times to further increase the dopant concentration distributed throughout the heavily-doped semiconductor layer. The resultant dopant-semiconductor metastable alloy enables a low film resistivity at room temperature and superconductivity at low temperature. In some embodiments of the present invention, the electrical resistivity at room temperature of resultant dopant-semiconductor metastable alloy is equal to or lower than $1.5\times10^{-4}$ $\Omega$cm or, equivalently, approaching that of metallic films.

Figure 9A:
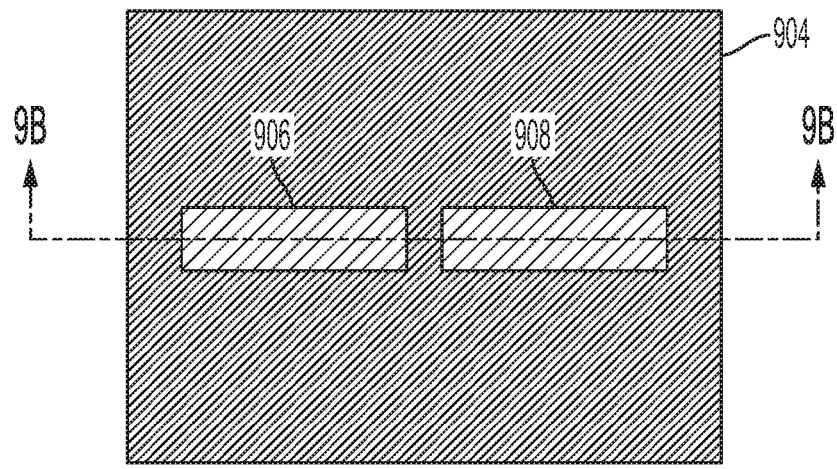
FIG. 9A is a schematic illustration of a plan view of a substrate wherein the first and second regions have been implanted and annealed to form a first superconducting region and a second superconducting region according to an embodiment of the present invention.
Figure 9B:
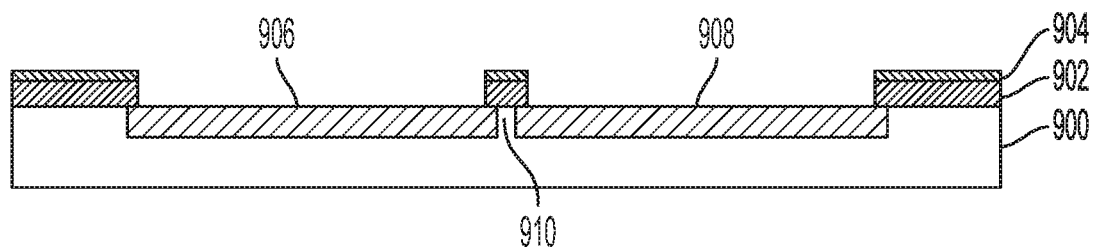
FIG. 9B is a schematic illustration of a cross-sectional view of a substrate wherein the first and second regions have been implanted and annealed to form a first superconducting region and a second superconducting region according to an embodiment of the present invention.

The process for forming a quantum mechanical device according to some embodiments of the present invention may include annealing the first and second regions to form first and second superconducting regions. FIGS. 9A and 9B are schematic illustrations of a plan view and a cross-sectional view of a substrate 900 wherein the first and second regions have been annealed to form a first superconducting region 906 and a second superconducting region 908. The region 910 of the substrate between the first superconducting region 906 and the second superconducting region 908 remains undoped, because the capping layer 902 prevents the layer of dopant 904 from being implanted or otherwise absorbed in that region. The process may include annealing the first and second regions a plurality of times to form a crystalline superconductor. The first and second regions may be implanted and annealed multiple times to form the first superconducting region 906 and the second superconducting region 908. The annealing may be, for example, laser annealing. The width of the region 910 can also be tailored by varying the implant and anneal conditions. Shallow implants with implant energy of less than 1 keV may be employed to limit the lateral dopant spread or implant straggle. Annealing the doped regions may increase the depth as well as the width of the first superconducting region 906 and the second superconducting region 908, thereby reducing the separation of the first superconducting region 906 and the second superconducting region 908. However, an excessive solid-phase dopant diffusion may not be desirable in a highly-doped, metastable semiconductor-dopant alloy because it leads to dopant precipitation and formation of dopant clusters. Dopant clusters may contribute to quantum decoherence reducing the qubit coherence time.

According to some embodiments, the annealing is used to drive the dopant laterally into the region 910 without inducing precipitation of dopants in regions 906 and 908. Very short anneals (<1 msec) may not move/diffuse dopants in solid materials to any appreciable distance of more than 1-3 nm and ultra short anneals (<1 microsecond) may not allow dopants to move to their nearest neighbors (a distance of the order of 1 nm). Such short anneals can be employed to activate and drive the dopant laterally by 1-3 nanometers without excessive dopant precipitation in regions 906/908. A more efficient method of both activating dopants and diffusing them laterally without precipitation is nanosecond-scale laser melt annealing described above. In order to employ such ultra-short laser annealing, doped regions 806/808 must be melted selectively to the undoped region 810/910. This can be accomplished if the doped regions 806/808 have lower melting points than that of the undoped region 810/910 interior. For instance, implanted regions 806/808 may exhibit a suppression of their melting points with respect to an unimplanted crystal by as much as 200-250° C. due to an implant-induced crystal damage and amorphization. Furthermore, the implant-induced crystal damage extends underneath the oxide mandrel 610 due to implanted ion lateral struggle. Accordingly, the melting point of damaged crystalline material underneath the oxide mandrel will be graded with a higher melting point being in the interior region of 810/910 and lower melting point being at the edges of 810/910. By tuning laser incident energy density, the extent of melting underneath the oxide mandrel 610 can be controlled. The dopants will have sufficient time during nanosecond-scale laser pulses to redistribute laterally in the molten layer up to the lateral solid boundary forming an abrupt profile between regions 910 and 906/908. Accordingly, in some embodiments, the width of region 910 is controlled by the width of oxide mandrel 610, implantation parameters, namely implant energy, that affect implanted ion lateral straggle and the extent of crystal damage underneath mandrel 610, and annealing parameters such as incident laser energy density that affect the extent of crystal melting underneath oxide mandrel 610. Conflicting implant requirements may exist for a dopant implantation process due to the first requirement of minimizing residual doping of the region underneath oxide mandrel 610 and the second requirement of controlling the extent of lateral and vertical crystal damage to set the boundaries of regions 906 and 908. These conflicting requirements can be resolved by introducing an additional PAI implantation of regions 806/808 with their native ions, i.e. implanting Si+ into silicon substrate or implanting Ge+ into germanium substrate. In this case, the PAI implantation parameters for native ions are chosen to control the extent of desirable crystal damage and the implantation parameters for dopant ions are chosen to minimize residual doping of region 810/910. In some embodiments, the dopant ion implantation energy is chosen to be less than 1 keV and preferably less than 500 eV while the native ion implantation energy is chosen to be more than 1 keV, and preferably more than 10 keV. Yet, by implanting the dopant into the regions 906/908, the region 910 may become a conducting region at room temperature due to a lateral implant straggle. The first superconducting region 906, the second superconducting region 908, and the conducting region may form a Josephson junction at low temperatures having a higher critical current than a Josephson junction with a dielectric gate.

The process may include removing the oxide layer, for example, using DHF. FIGS. 1A and 1B are schematic illustrations of a plan view and a cross-sectional view of the quantum mechanical device of FIGS. 9A and 9B after removal of the oxide layer. The first and second superconducting regions 104, 106 and the undoped crystalline region 108 form a Josephson junction at low temperature. The lateral dopant profile across regions 104, 106, and 108 is shown in FIG. 1C. The undoped or lightly-doped region 108 may be conducting at room temperature due to its residual doping, however, its electrical conductivity vanishes at low temperatures. The dopant profile transition regions between regions 104/106 and region 108 are minimized by controlling implant lateral straggle and selecting annealing processes with little dopant diffusion in solid phase.

Figure 10A:
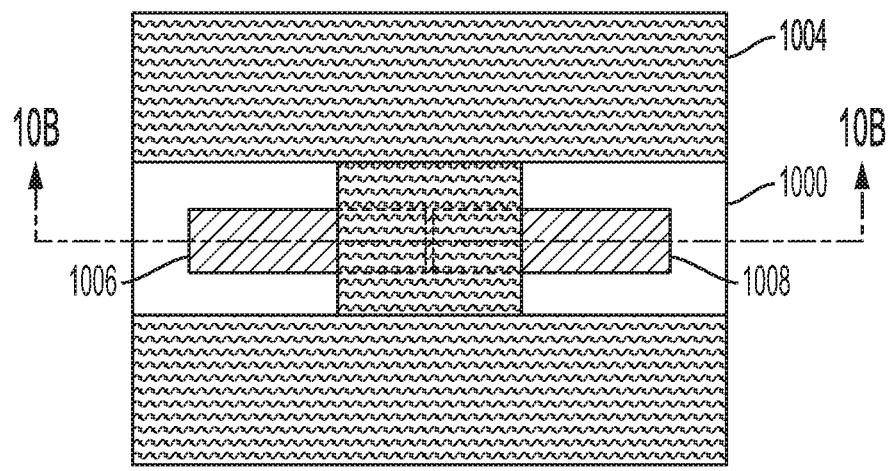
FIG. 10A is a schematic illustration of a plan view of a substrate with a first layer and a second layer of a lift off resist formed thereon.
Figure 10B:
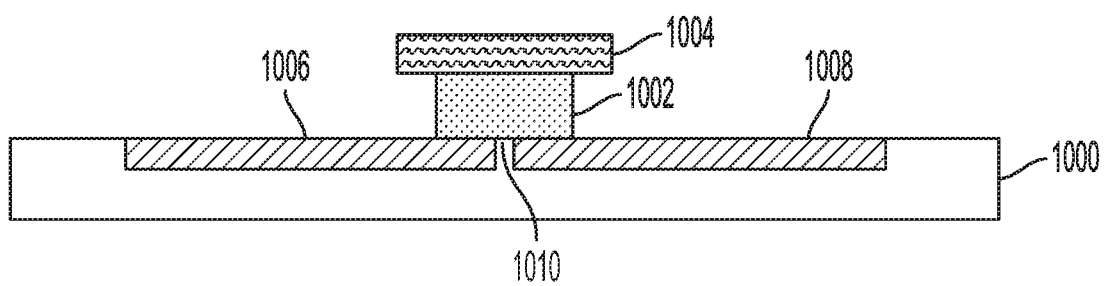
FIG. 10B is a schematic illustration of a cross-sectional view of a substrate with a first layer and a second layer of a lift off resist formed thereon.

According to some embodiments of the invention, the Josephson junction may be coupled to other structures using wires. FIGS. 10A-12B are schematic illustrations of a process for forming wires connected to the Josephson junction. The process may include patterning a lift off resist for the wires. FIGS. 10A and 10B are schematic illustrations of a plan view and a cross-sectional view of a substrate 1000 with a first layer 1002 and a second layer 1004 of a lift off resist formed thereon. The first layer 1002 covers a portion of the first superconducting region 1006 and the second superconducting region 1008, as well as the region 1010 separating the first superconducting region 1006 from the second superconducting region 1008. The first layer 1002 may be undercut to enable lift off of the resist after the wire material has been deposited.

Figure 11A:
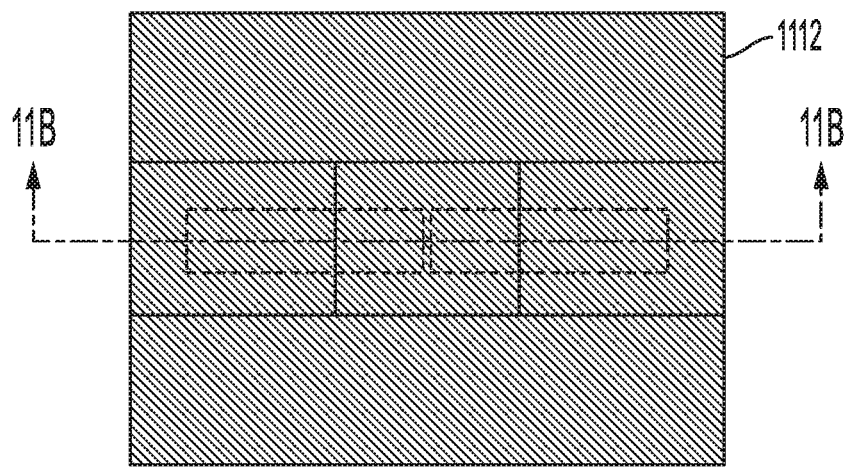
FIG. 11A is a schematic illustration of a plan view of a substrate with a superconducting material deposited thereon.
Figure 11B:
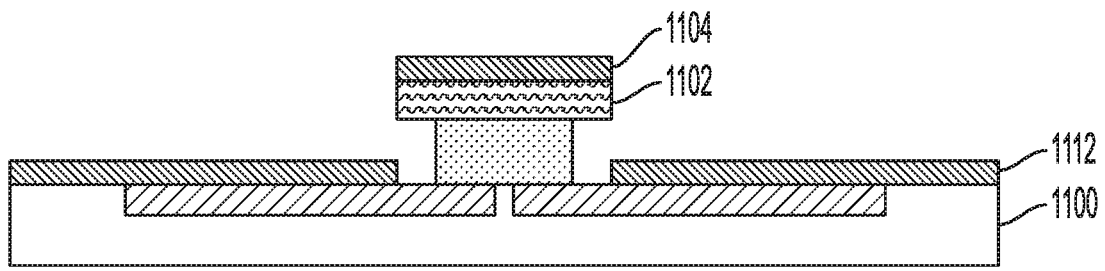
FIG. 11B is a schematic illustration of a cross-sectional view of a substrate with a superconducting material deposited thereon.

The process may include depositing a superconducting material. FIGS. 11A and 11B are schematic illustrations of a plan view and a cross-sectional view of a substrate 1100 with a superconducting material 1112 deposited thereon. The superconducting material 1112 contacts the portions of the substrate 1100 lateral to and exposed by the first layer 1102 and the second layer 1104 of the resist.

Figure 12A:
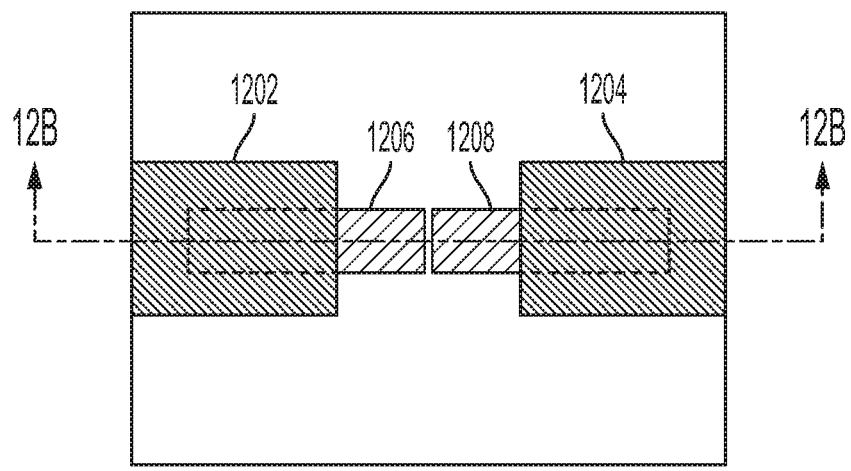
FIG. 12A is a schematic illustration of a plan view of a substrate with a first superconducting wire in contact with the first superconducting region of the substrate, and a second superconducting wire in contact with the second superconducting region of the substrate.
Figure 12B:
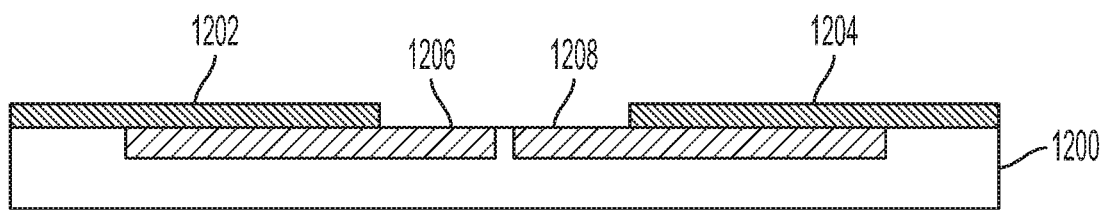
FIG. 12B is a schematic illustration of a cross-sectional view of a substrate with a first superconducting wire in contact with the first superconducting region of the substrate, and a second superconducting wire in contact with the second superconducting region of the substrate.

The process may include lifting off the resist and the superconducting material deposited thereon. FIGS. 12A and 12B are schematic illustrations of a plan view and a cross-sectional view of a substrate 1200 with a first superconducting wire 1202 in contact with the first superconducting region 1206 of the substrate 1200, and a second superconducting wire 1204 in contact with the second superconducting region 1208 of the substrate 1200. The first superconducting wire 1202 and second superconducting wire 1204 may connect the Josephson junction to other structures, such as capacitor or resonators, for example. The capacitors or resonators may be formed during formation of the super conducting wires 1202, 1204 or may be formed during a separate process. FIG. 2 is a schematic illustration of a quantum mechanical device 200 that includes capacitors 218, 220 connected to the superconducting wires 214, 216 to form a Josephson junction qubit.

According to some embodiments of the present invention, the crystalline region between the two superconducting regions is a conducting crystalline region at room temperature instead of an undoped crystalline region. According to some embodiments of the present invention, a quantum mechanical device includes a monolithic crystalline structure that includes a first region doped to provide a first superconducting region at low temperatures, a second region doped to provide a second superconducting region at low temperatures, and a third region doped to provide a first conducting region at room temperature. The first conducting region separates the first superconducting region from the second superconducting region. The first and second superconducting regions and the first conducting region form a Josephson junction at low temperatures.

Figure 13:
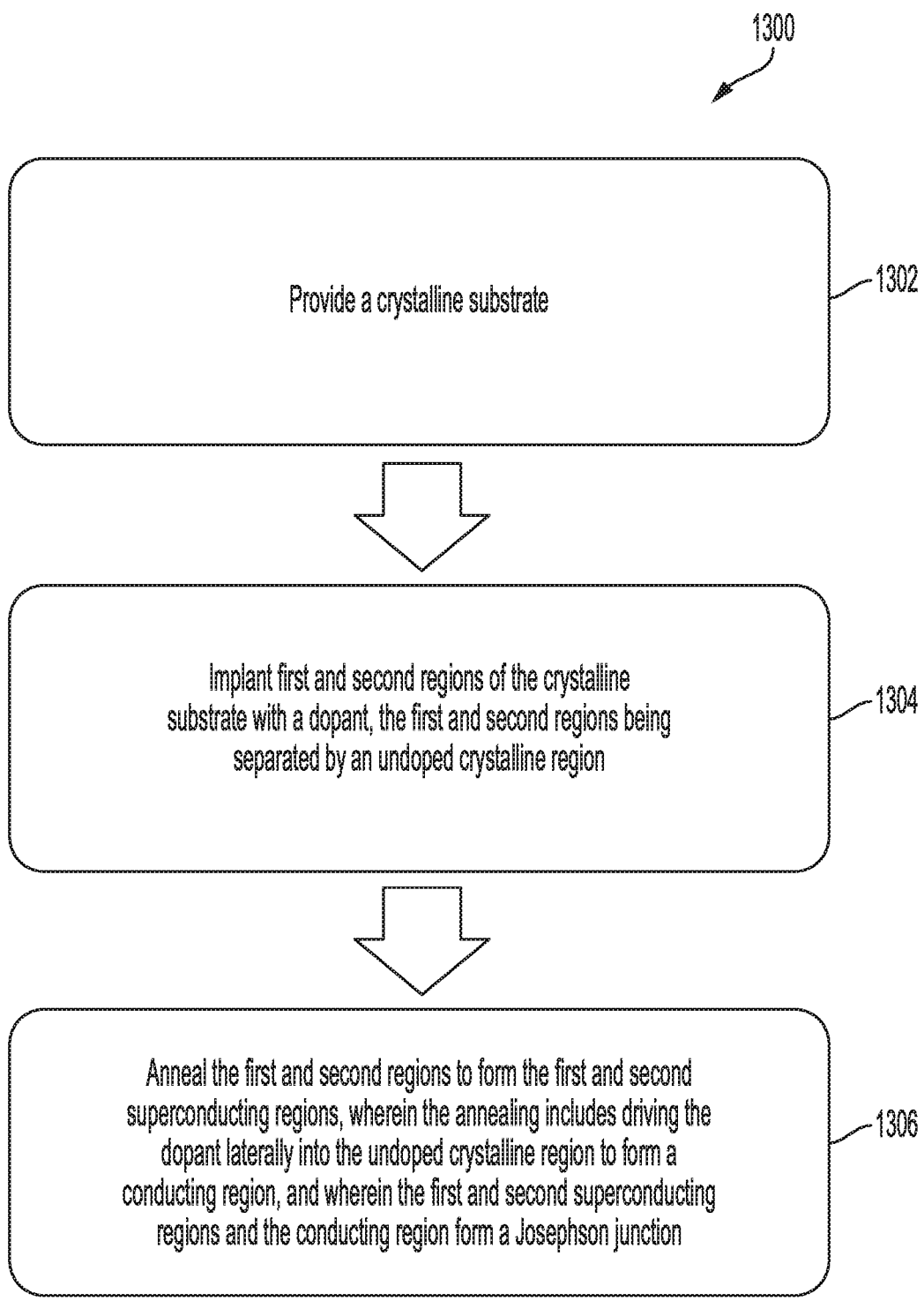
FIG. 13 is a flowchart illustrating a method of producing a quantum mechanical device according to an embodiment of the invention.

FIG. 13 is a flowchart illustrating a method 1300 of producing a quantum mechanical device according to an embodiment of the invention. The method 1300 includes providing a crystalline substrate 1302, and implanting first and second regions of the crystalline substrate with a dopant and native elements, the first and second regions being separated by an undoped crystalline region 1304. The method 1300 includes annealing the first and second regions to form the first and second superconducting regions at low temperatures, wherein the annealing includes driving the dopant laterally into the undoped crystalline region to form a conducting region at room temperature, and wherein the first and second superconducting regions and the conducting region form a Josephson junction 1306 at low temperatures.

Embodiments of the invention include a Josephson junction device with a crystalline Josephson junction barrier, instead of an $SiO_2$ or other oxide dielectric. The barrier may include, for example, single crystal undoped or lightly-doped Si or Ge. The crystalline materials may have fewer defects and therefor may result in improved quantum coherence. The device fabrication may be compatible with conventional CMOS processing, and may have a short process flow. The device frequency can be tuned lithographically.

According to some embodiments of the invention, a Josephson junction qubit device uses superconducting Si or Ge as the source and drain of the Josephson junction and undoped or lightly-doped crystalline Si or Ge as the device junction. According to some embodiments of the present invention, a method to produce a quantum mechanical device includes patterning an oxide mandrel 6-15 nm wide on undoped Si. The method includes forming p-type epitaxial layer (P+ epi) on both sides of oxide mandrel followed by ion implantation and laser annealing to crystallize the implanted semiconductor. The method includes removing the oxide mandrel with DHF. The method may also include forming capacitor and resonator wires with lift off processing.

According to some embodiments of the present invention, a Josephson Junction (JJ) qubit device includes superconducting semiconductor regions forming a source and a drain region of the JJ, and an undoped or lightly-doped crystalline semiconductor region forming a JJ gate region located between the source and the drain regions.

According to some embodiments of the present invention, a method of forming a JJ qubit device includes patterning an oxide mandrel on an undoped Si substrate, and forming P+ epi regions on both sides of the oxide mandrel followed by implantation and annealing. The method includes annealing the P+ epi regions to form crystallized implanted Si regions, and removing the oxide mandrel to form an undoped crystalline Si region forming a JJ gate region located between the P+ epi regions. The method according to some embodiments further includes forming capacitor and resonator wires with lift off processing.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A quantum mechanical device, comprising:
    a monolithic crystalline structure, said monolithic crystalline structure comprising:
        a first region doped to provide a first superconducting region; and
        a second region doped to provide a second superconducting region, said second superconducting region being separated from said first superconducting region by an undoped crystalline region,
    wherein said first and second superconducting regions and said undoped crystalline region form a Josephson junction.

2. The quantum mechanical device according to claim 1, wherein said monolithic crystalline structure comprises undoped crystalline Si, and wherein said first and second superconducting regions comprise superconducting Si.

3. The quantum mechanical device according to claim 1, wherein said first and second superconducting regions comprise B-doped Si.

4. The quantum mechanical device according to claim 1, wherein said first and second superconducting regions comprise Ga-doped Si.

5. The quantum mechanical device according to claim 1, wherein said monolithic crystalline structure comprises undoped crystalline Ge, and wherein said first and second superconducting regions comprise superconducting Ge.

6. The quantum mechanical device according to claim 1, wherein said first and second superconducting regions comprise Ga-doped Ge.

7. The quantum mechanical device according to claim 1, wherein said first and second superconducting regions comprise Al-doped Ge.

8. The quantum mechanical device according to claim 1, wherein said monolithic crystalline structure comprises an upper surface a lower surface opposite said upper surface, and
    wherein said first and second superconducting regions and said undoped crystalline region each comprise an upper surface that is coplanar with said upper surface of said monolithic crystalline structure.

9. The quantum mechanical device according to claim 1, further comprising a superconducting wire disposed on a surface of said monolithic crystalline structure in contact with said first superconducting region, said superconducting wire comprising a different superconducting material than said first superconducting region.

10. The quantum mechanical device according to claim 9, further comprising:
    a second superconducting wire disposed on the surface of said monolithic crystalline structure in contact with said second superconducting region;
    a first capacitor in contact with said first-mentioned superconducting wire; and
    a second capacitor in contact with said second superconducting wire,
    wherein said quantum mechanical device is a Josephson junction qubit.

11. The quantum mechanical device according to claim 1, wherein said undoped crystalline region separates said first and second superconducting regions by less than 5 nm.

12. The quantum mechanical device according to claim 1, wherein the first superconducting region and the second superconducting region are crystalline.

13. A quantum mechanical device, comprising:
    a monolithic crystalline structure, said monolithic crystalline structure comprising:
        a first region doped to provide a first superconducting region; and
        a second region doped to provide a second superconducting region; and
        a third region doped to provide a metal region, said second superconducting region being separated from said first superconducting region by said metal region,
    wherein said first and second superconducting regions and said metal region form a Josephson junction.

14. A method of producing a quantum mechanical device, comprising:
    providing a crystalline substrate; and
    doping first and second regions of said crystalline substrate to form first and second superconducting regions while reserving a region between said first and second superconducting regions as an undoped crystalline region,
    wherein said first and second superconducting regions and said undoped crystalline region form a Josephson junction.

15. The method of producing a quantum mechanical device according to claim 14, wherein doping said first and second regions of said crystalline substrate with a dopant comprises adsorbing said dopant on said first and second regions of said crystalline substrate and annealing said first and second regions of said crystalline substrate.

16. The method of producing a quantum mechanical device according to claim 14, wherein said crystalline substrate comprises undoped crystalline Si, and wherein said first and second regions of said crystalline substrate are doped with B or Ga.

17. The method of producing a quantum mechanical device according to claim 14, wherein doping said first and second regions of said crystalline substrate comprises:
    implanting said first and second regions of said crystalline substrate with a dopant; and
    annealing said first and second regions to form said first and second superconducting regions.

18. The method of producing a quantum mechanical device according to claim 17, wherein annealing said first and second regions to form said first and second superconducting regions comprises laser annealing said first and second regions to form said first and second superconducting regions.

19. The method of producing a quantum mechanical device according to claim 11, wherein said undoped crystalline region separates said first and second superconducting regions by less than 5 nm.

20. The method of producing a quantum mechanical device according to claim 11, further comprising forming a first superconducting wire in contact with said first superconducting region, and a second superconducting wire in contact with said second superconducting region.

\* \* \* \* \*